US006373114B1

(12) United States Patent
Jeng et al.

(10) Patent No.: US 6,373,114 B1
(45) Date of Patent: Apr. 16, 2002

(54) BARRIER IN GATE STACK FOR IMPROVED GATE DIELECTRIC INTEGRITY

(75) Inventors: Nanseng Jeng, Vancouver, WA (US); Aftab Ahmad, Colorado Springs, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/178,306

(22) Filed: Oct. 23, 1998

(51) Int. Cl.$^7$ .................. H01L 29/94; H01L 31/113; H01L 31/119
(52) U.S. Cl. ........................ 257/413; 257/368
(58) Field of Search ................ 257/413, 368; 438/585, 588

(56) References Cited

U.S. PATENT DOCUMENTS

| | | |
|---|---|---|
| 4,839,301 A | 6/1989 | Lee |
| 4,996,081 A | 2/1991 | Ellul et al. |
| 5,057,499 A | 10/1991 | Lowrey et al. |
| 5,073,509 A | 12/1991 | Lee |
| 5,094,712 A | 3/1992 | Becker et al. |
| 5,100,826 A | 3/1992 | Dennison |
| 5,177,027 A | 1/1993 | Lowrey et al. |
| 5,231,056 A | 7/1993 | Sandhu |
| 5,236,865 A | 8/1993 | Sandhu et al. |
| 5,240,874 A | 8/1993 | Roberts |
| 5,264,724 A | 11/1993 | Brown et al. |
| 5,266,510 A | 11/1993 | Lee |
| 5,272,367 A | 12/1993 | Dennison et al. |
| 5,306,951 A | 4/1994 | Lee et al. |
| 5,341,016 A | 8/1994 | Prall et al. |
| 5,345,104 A | 9/1994 | Prall et al. |
| 5,349,494 A | 9/1994 | Ando |
| 5,360,769 A | 11/1994 | Thakur et al. |
| 5,364,803 A * | 11/1994 | Lur et al. ............... 437/40 |
| 5,376,593 A | 12/1994 | Sandhu et al. |
| 5,378,641 A | 1/1995 | Cheffings |
| 5,393,683 A | 2/1995 | Mathews et al. |
| 5,405,791 A | 4/1995 | Ahmad et al. |
| 5,407,870 A | 4/1995 | Okada et al. |
| 5,409,853 A * | 4/1995 | Yu ............... 437/41 |
| 5,429,972 A | 7/1995 | Anjum et al. |
| 5,472,896 A | 12/1995 | Chen et al. |
| 5,527,718 A * | 6/1996 | Seita et al. ............ 437/11 |
| 5,719,410 A * | 2/1998 | Suehiro et al. ......... 257/77 |
| 5,940,725 A * | 8/1999 | Hunter et al. .......... 438/592 |
| 6,015,997 A * | 1/2000 | Hu et al. ............... 257/412 |
| 6,178,306 B1 | 2/2000 | Gardner ................. 438/657 |

FOREIGN PATENT DOCUMENTS

EP   0 682 359 A1 * 11/1995   .............. 29/43

OTHER PUBLICATIONS

Shimizu et al. "Impact of surface Proximity Gettering and Nitrided Oxide Side–Wall Spacer by Nitrogen Implantation on Sub–Quarter Micron CMOS LDD FETs", IEDM 95, pp. 859–862 (1995).

Silicon Processing for the VLSI Era–vol. 1–Processing Technology, pp. 191–194.

* cited by examiner

Primary Examiner—Steven Loke
Assistant Examiner—Douglas W. Owens
(74) Attorney, Agent, or Firm—Knobbe Martens Olson & Bear LLP

(57) ABSTRACT

A barrier layer comprising silicon mixed with an impurity is disclosed for protection of gate dielectrics in integrated transistors. In particular, the barrier layer comprises silicon incorporating nitrogen. The nitrogen can be incorporated into an upper portion of the gate polysilicon during deposition, or a silicon layer doped with nitrogen after silicon deposition. The layer is of particular utility in conjunction with CVD tungsten silicide straps.

13 Claims, 4 Drawing Sheets

BARRIER IN GATE STACK FOR IMPROVED GATE DIELECTRIC INTEGRITY

FIELD OF THE INVENTION

The present invention relates to transistor gate stacks in integrated circuits, and more particularly to preventing degradation of gate dielectrics during processing.

BACKGROUND OF THE INVENTION

In contemporary fabrication of integrated circuits, the metal-oxide-semiconductor field-effect transistor (MOSFET) has long been the most important device. Conductive gate material is formed over a gate dielectric (typically silicon dioxide), which in turn overlies a semiconductor substrate (typically single-crystal silicon).

The use of doped polycrystalline silicon (polysilicon, or poly for short) for MOSFET gate electrodes has entailed many advantages over purely metal gates, such as aluminum. Several advantages derive from the high melting point of polysilicon as compared to aluminum. Aluminum gates, for example, would have to be formed after high temperature dopant implantation and drive steps. Aluminum deposited after source/drain formation could be misaligned from the MOSFET channel, leading to parasitic gate/drain or gate/source overlap capacitance. By comparison, polysilicon gates can serve as a mask for doping source and drain regions, creating channels which are self-aligned to the gate. Additionally, unlike metals deposited directly over gate oxide, polysilicon will not react with the gate oxide, nor does it cause excessive dopant depletion. Because polysilicon gates can be formed prior to many high temperature steps, including glass reflow, the polysilicon deposited for the gate electrode may also function as an interconnect. For example, dynamic random access memory (DRAM) word lines may be etched from the polysilicon layer deposited for the gates (often referred to in the industry as "poly-1").

Unfortunately, polysilicon resistivity is considerably higher than that of aluminum or other metals. Additionally, efforts to increase circuit density by scaling down device dimensions lead to polysilicon lines of decreasing width, which in turn leaves a small cross-sectional line area through which to conduct current. High polysilicon resistivity, combined with small line width, results in a high overall interconnect resistance, entailing greater power consumption, long propagation delays and slower access speeds. As integrated circuits are scaled down, access speed becomes a critical issue so methods of reducing of gate/interconnect resistivity are required.

In pursuit of lower overall gate resistance, highly conductive layers (e.g., metal, metal silicide, and/or metal nitride) have been implemented over the gate polysilicon, thus lowering the overall resistivity of the interconnect lines while retaining the gate integrity provided by polysilicon. Typically, a layer of metal silicide (such as $WSi_x$ or $TiSi_x$) is formed over the polysilicon. Such as silicide/polysilicon composite structure is often referred to as a "polycide." A metal layer may overlie the metal silicide, reducing resistivity even further, though many prior art gate structures lack the pure metal layer. Alternatively, a metal layer may also be deposited directly over the polysilicon, without the intervening metal silicide, depending upon stress and adhesion factors. A dielectric capping layer generally overlies the conductive layers of the gate stack.

FIG. 1 illustrates a typical gate stack 10 overlying a semiconductor substrate 20 prior to patterning. The illustrated stack includes a protective cap layer 12 (comprising, e.g., silicon nitride), a silicide layer 14 (e.g., $WSi_x$), and a conductively doped polysilicon layer 16, all overlying a gate oxide 18 which has been grown out of a single crystal silicon substrate 20. After the layers which make up the gate stack 10 have been formed, gate structures must be patterned in accordance with an integrated circuit design (e.g., a dynamic random access memory, or DRAM, array).

FIG. 2 illustrates the result of patterning. After a resist mask 24 is formed by standard photolithographic processes, the stack 10 is etched through, thus producing a gate electrode 26 comprised of patterned gate polysilicon 28, silicide 30, and dielectric cap 32 straps, as shown. In general, anisotropic etches are utilized to create vertical profiles on gate structures 26, although the particulars may vary depending upon the stack materials. Typical etch chemistries include fluorine- or chlorine-based plasmas.

A high quality gate insulator is required for the reliable operation of the MOSFET device and of the circuit employing the MOSFET. Susceptibility to hot carrier effects and consequent charge trapping, high defect densities, silicon-oxide interface states, pinholes and oxide thinning can all cause punch-through or tunneling current leakage. In turn, junction leakage results in increased threshold voltage and unreliable circuit operation. For a variety of reasons, the processes involved in depositing the various gate stack layers and in patterning the gates, tends to degrade the quality of the gate oxide 18 underlying the patterned gate 26. For example, exposure to fluorine ions can damage oxide bonds within the gate oxide 18, creating charge trap sites. As fluorine and other contaminants have a tendency to diffuse through polysilicon, such gate oxide damage can penetrate even below the patterned gate stack 26. As a result, the gate dielectric 18 must either be made thicker (entailing greater power consumption) or early breakdown will occur.

Accordingly, a need exists for gate fabrication processes and structures which permit low overall resistance at the gate level while maintaining high quality gate dielectric compositions.

SUMMARY OF THE INVENTION

In accordance with one aspect of the present invention, a gate stack in an integrated transistor includes a gate dielectric overlying a semiconductor substrate, a first silicon layer overlying the gate dielectric, and a conductive layer directly overlying silicon layer. A nitrogen-containing second silicon layer is interposed between the first silicon layer and the conductive layer.

In accordance with another aspect of the present invention, an integrated circuit includes a semiconductor substrate, a dielectric layer overlying the substrate, a conductive silicon layer overlying the dielectric layer, and a metal silicide overlying the silicon layer. A non-metallic barrier layer is interposed between the metal silicide layer and the silicon layer. While the barrier layer electrically connects the metal silicide and the silicon layer, it also inhibits diffusion of impurities between those layers.

In accordance with another aspect of the present invention, a gate stack in an integrated circuit includes a polysilicon gate layer and a silicon-rich silicon nitride layer directly overlying the gate layer.

In accordance with another aspect of the present invention, an integrated circuit has a gate stack, including a conductive silicon gate layer, a silicon-based conductive barrier layer directly overlying the gate layer, and a metallic strap directly overlying the barrier layer.

In accordance with another aspect of the present invention, a process for forming an integrated circuit on a semiconductor substrate includes forming a silicon layer over the substrate. Nitrogen is incorporated into an upper portion of the silicon layer, such that the upper portion includes nitrogen to silicon in a ratio of less than 4:3. A metallic layer is deposited over the silicon layer by chemical vapor deposition.

In accordance with another aspect of the present invention, a method of forming a gate stack for an integrated transistor includes forming a gate silicon layer over a gate channel region in a semiconductor substrate. An upper portion of the gate silicon is then implanted with a non-conducting impurity.

In accordance with another aspect of the present invention, a method of forming a gate stack over a semiconductor substrate includes forming a gate dielectric directly over the substrate. A silicon source gas is flowed over the gate dielectric, thereby forming a first silicon layer directly over the gate dielectric. While continuing to flow the silicon source gas, a nitrogen source gas is flowed, thereby forming a second silicon layer directly over the first silicon layer.

DETAILED DESCRIPTION OF THE PREFERRED EMBODIMENT

The present invention provides a method of preventing degradation of transistor gates in integrated circuits. Although the preferred embodiments are discussed in terms of DRAM gate electrodes and word lines, those having skill in the art of integrated circuit fabrication may find application to the present invention for electrodes or conducting lines in other contexts. Furthermore, while the preferred gate dielectric comprises silicon oxide, it will be understood that the present invention can aid in protecting the integrity of gate stacks having other gate dielectric materials, such as silicon nitride, among others.

As discussed in the "Background" section above, gate electrodes often comprise conductively doped polysilicon strapped with one or more highly conductive layers to lower total interconnect resistance. The conductive straps generally contain metal, such as pure metal, metal silicide, or metal nitride layers in various combinations. Refractory metals, such as tantalum (Ta), titanium (Ti) and tungsten (W), can form stable conductive silicide or nitrides and are thus of particular utility in low resistance gate interconnects. Other exemplary metals include molybdenum (Mo), cobalt (Co), magnesium (Mg), nickel (Ni) and copper (Cu). Platinum (Pt), silver (Ag) and paladium (Pd) are also quite commonly used for wiring integrated circuits. Various combinations or sequences among gate stack layers are chosen to maximize adhesion, conductivity, and minimize stress within the composite gate stack. While interconnect conduction may mostly occur in highly conductive upper layers, those upper layers must remain in electrical communication with the doped polysilicon layer, particularly at points where the polysilicon must serve as a gate for switching a transistor within the silicon substrate.

Figure 1:
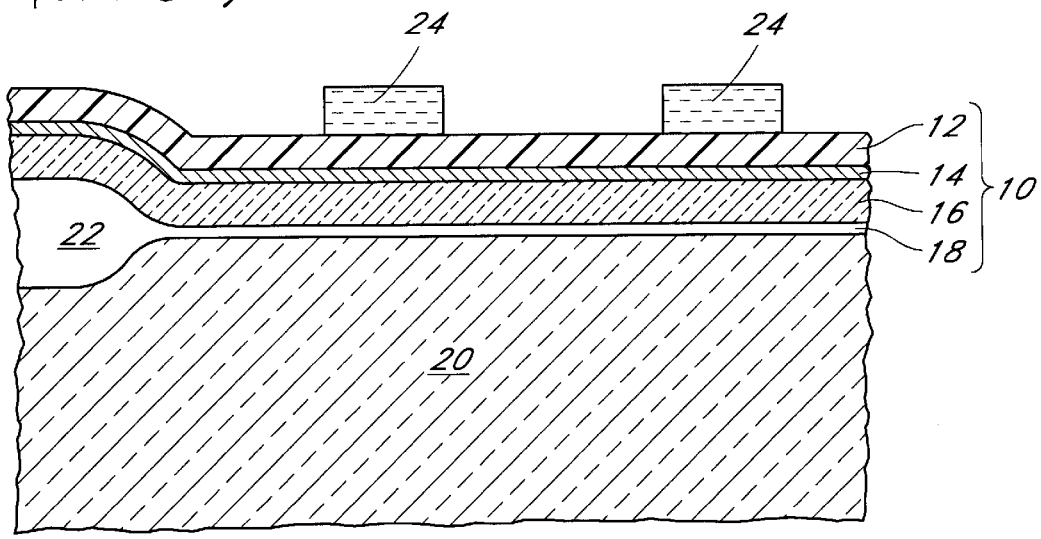
FIGS. 1–2 are partial, cross-sectional representations of a partially fabricated integrated circuit, generally illustrating conventional gate fabrication.
Figure 2:
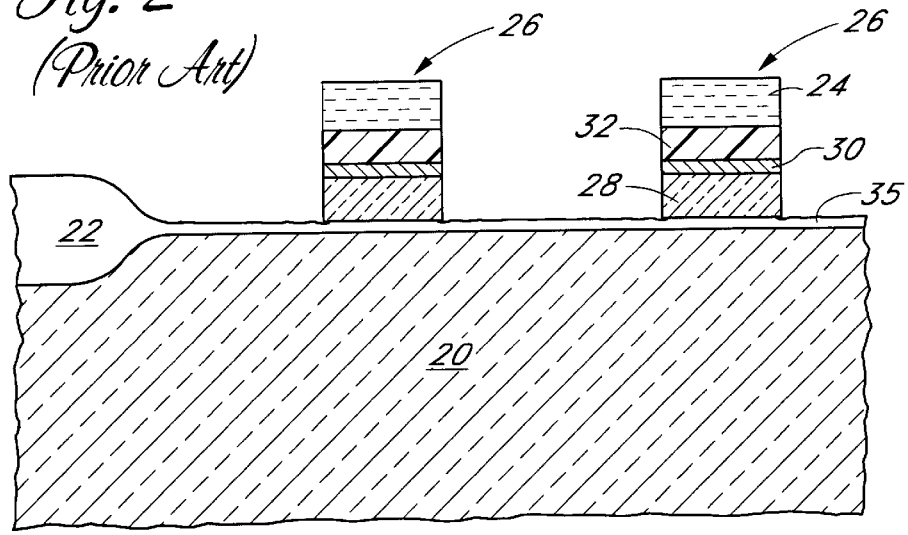
Figure 3:
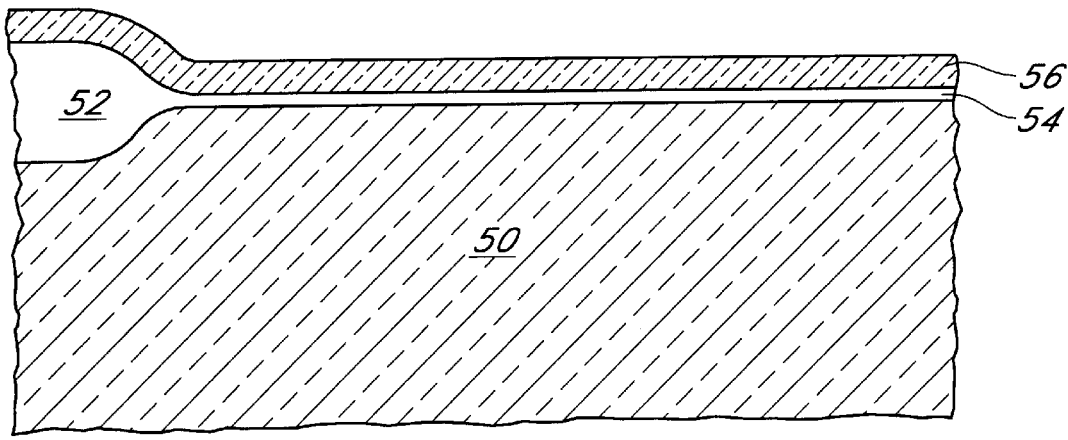
FIGS. 3–6 are partial, cross-sectional representations of a partially fabricated integrated circuit, generally illustrating a method of fabricating a gate stack in accordance with a preferred embodiment of the present invention.

FIG. 3 illustrates a semiconductor substrate 50, comprising a silicon wafer in accordance with contemporary integrated circuit design. It will be understood by one of skill in the art of semiconductor processing, however, that the "substrate" in alternative embodiments may comprise other forms of semiconductor layers which include active or operable portions of semiconductor devices. Active areas to be formed within the substrate 50 are isolated by field oxide 52 grown through a mask, though trench isolation can also be used in alternative embodiments. A gate dielectric 54 is then formed over the remainder of the substrate 50. Preferably, the gate dielectric 54 comprises a high quality thermal silicon dioxide, grown by exposing the silicon substrate 50 to an oxidizing environment at high temperatures. It will be readily recognized by one of skill in the art, however, that the present invention will have application for alternative gate dielectrics, such as silicon nitride. In accordance with the preferred embodiment, the gate dielectric 54 should have a thickness of less than about 200 Å, most preferably about 50 Å.

Also shown in FIG. 3, a first or partial silicon layer 56 is then formed over the gate dielectric layer 54. The thickness of the partial silicon layer 56 depends upon the operational and design rules for the particular integrated circuit and upon the constitution of other layers in the stack, as will be understood by one of skill in integrated circuit fabrication. The partial silicon layer 56 can be between about 200 Å and 3,000 Å thick. The preferred stack materials (including a barrier layer described below) enable thinner gate silicon layers than have conventionally been practicable. Accordingly, the illustrated partial silicon layer is preferably less than about 500 Å, and more preferably between about 300 Å and 400 Å. The silicon layer 56 can be formed by conventional chemical vapor deposition ("CVD") of silicon and can be in situ doped for conductivity. It will be understood that the preferred polysilicon 56 can be replaced with amorphous silicon.

Figure 4:
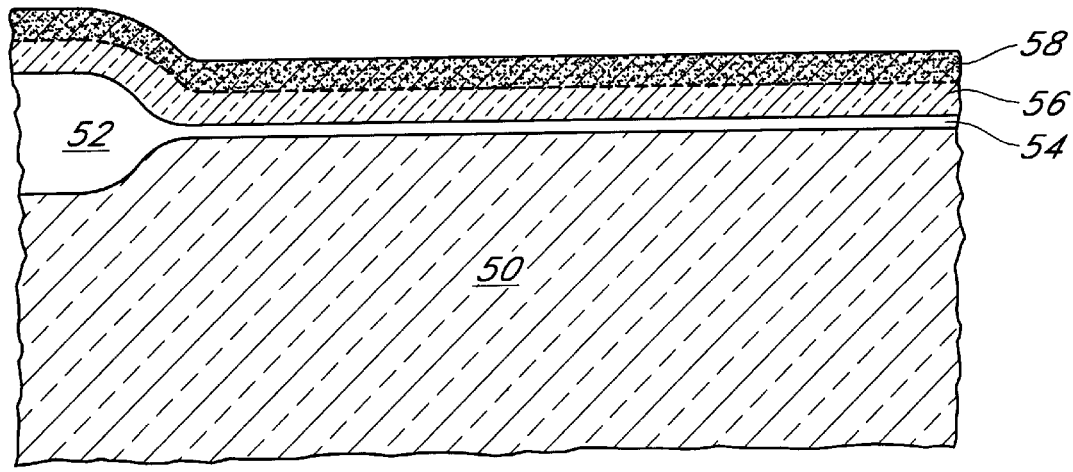

Referring now to FIG. 4, a non-metallic and in particular silicon-based barrier film 58 is formed over the partial silicon layer 56. The barrier film 58 can also be considered a second silicon layer, or the upper part of the gate silicon layer. As with the partial silicon layer 56, the barrier film 58 may comprise polysilicon or amorphous silicon, and may be in situ doped for conductivity. Additionally, however, the barrier film 58 includes an impurity which reduces contaminant diffusion through the silicon, while maintaining sufficient electrical connection between the partial silicon layer 56 and layers to be deposited over the barrier film 58.

Preferably, the impurity within the barrier film 58 comprises nitrogen in a ratio to silicon which is insufficient to produce stoichiometric silicon nitride ($Si_3N_4$). In particular, the ratio of nitrogen to silicon in the barrier film 58 is less than 4:3, preferably between about 4:10 and 4:3.5, particularly between about 4:5 and 4:3.5, and more preferably between about 4:5 and 4:4. It will be understood by one of skill in the art that the nitrogen content in this barrier film 58 can be optimized through routine experimentation so that the overlying metallic layers and underlying partial silicon layer 56 are electrically connected while the barrier film 58 effectively minimizes diffusion of contaminants through to the gate dielectric 54. The thickness of this layer also depends upon design and operational rules, but can in general range from 50 Å to 800 Å, preferably between about 100 Å and 500 Å, and most preferably less than about 200 Å.

In accordance with one embodiment, the preferred nitrogen-doped silicon film 58 is formed in situ following the deposition of the partial silicon layer 56. A nitrogen source gas is introduced into the gas flow during silicon deposition. An exemplary process includes flowing silane ($SiH_4$) and phosphine or arsine for a sufficient time to produce the partial silicon layer 56 of the desired thickness. The nitrogen source gas, preferably comprising ammonia ($NH_3$), is then introduced into the gas flow. The skilled artisan can readily determine, through routine experimentation, an appropriate volumetric ratio between the nitrogen source gas and the silicon source gas such as will achieve the optimal level of nitrogen content, as described above, during the nitride deposition phase. With ammonia and silane, the volumetric ratio is preferably between about 3:1 and 1:10. For example, 100 sccm of the nitrogen source gas can be introduced into a previously flowing 250 sccm of silane.

Most preferably, this nitride deposition is followed an anneal in a nitrogen environment, such as an RTP anneal at 1,000° C. for about 30 seconds. The nitrogen environment is also preferably ammonia gas, though other nitrogenous gases can also be used.

In accordance with another embodiment, the barrier film 58 can be fabricated by completing deposition of silicon to the desired overall silicon thickness in the same manner as the deposition of the partial silicon film 56. The upper portion of the silicon can then be implanted with a nitrogen ion implantation process. Such a nitrogen ion implantation is described in the context of nitrogen doping a substrate below the gate corner in U.S. patent application Ser. No. 08/871,210, filed Jun. 9, 1997. The disclosure of the implantation in the '210 application is incorporated by reference herein. It will be understood that a range of implantation energies results in a depth distribution for the implanted nitrogen. The skilled artisan can readily determine the doping concentration and implant energies for the nitrogen implantation, in view of the present disclosure and the disclosure of the '210 application, which will result in the desired distribution of nitrogen through the silicon of the barrier film 58. The amount of nitrogen doping preferably ranges from about $5 \times 10^{13}$ to $1 \times 10^{16}$ atoms/cm$^2$. A preferred implantation energy is in the range of about 10 keV to 100 keV.

Figure 5:
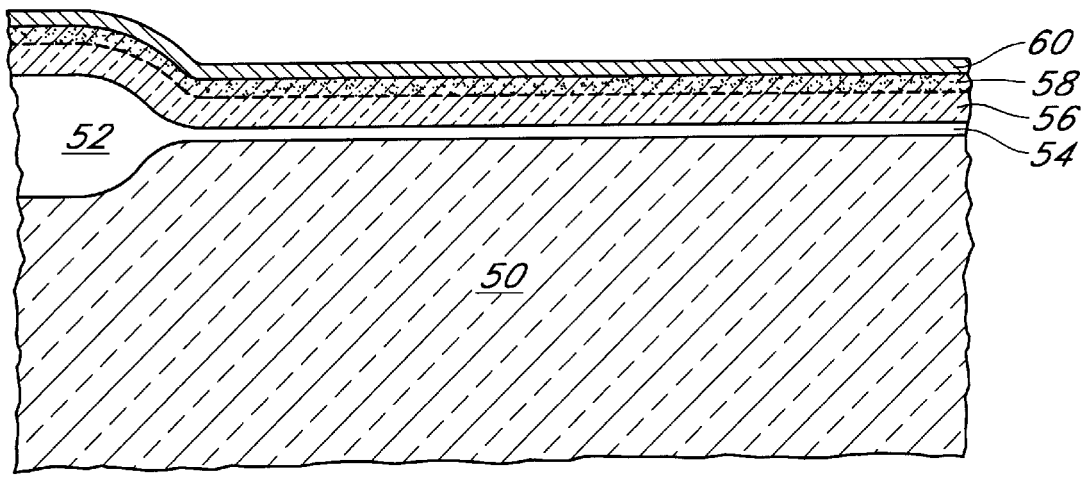

Referring now to FIG. 5, a metallic layer 60 is formed over the barrier film 58. The metallic layer 60 can comprise any of a number of highly conductive materials containing metals, and particularly materials which can be deposited by CVD. In the illustrated embodiment, the metallic layer 60 comprises a silicide, preferably tungsten silicide ($WSi_x$). Such silicide can be formed by depositing a metal layer and reacting the metal with the underlying silicon. Preferably, however, the metallic layer 60 is formed by CVD according to the following formula:

$$WF_6 + SiH_4 \rightarrow WSi_x + F_2 + H_2 \quad (1)$$

Alternatively, other silicon source gases (such as disilane, trisilane, di-chlorosilane, etc.) can be used in place of silane, and similarly other metal sources (such as titanium tetrachloride, etc.) can be used in the deposition process. Tungsten silicide formed by the above-noted preferred CVD process tends to incorporate fluorine into the film. Similarly, many CVD processes result in hydrogen residue within the deposited film. Furthermore, post-deposition high-temperature steps tend to cause diffusion of such contaminants through the underlying silicon layer in conventional gate stacks. Fluorine, for example, easily diffuses down through grain boundaries of polysilicon.

Diffusion of contaminants such as fluorine often takes place during a post-deposition anneal step which is conventionally performed after initial formation of a silicide. This anneal is performed to convert the deposited silicide to a lower resistance phase through grain growth and re-orientation during the anneal. The anneal typically takes place at between about 600° C. and 900° C. for about 25 minutes. Not only does fluorine tend to diffuse from the silicide into the gate poly during this anneal, but the re-orientation and grain growth tends to introduce stress and attendant defects in on the thin gate oxide.

In contrast, the preferred barrier film 58 of the present invention tends to slow down contaminant diffusion through the silicon layers 58, 56, such that contaminants are not allowed to reach and degrade the gate dielectric 54. Additionally, the barrier layer 58 prevents silicide grain penetration during the silicide reorientation anneal, due to the slow diffusivity of silicon within the barrier layer 58. Accordingly, the barrier film 58 also reduces the amount of stress created by the anneal. Furthermore, the use of the barrier film 58 enables use of thinner gate silicon (i.e., partial silicon layer 56).

Figure 6:
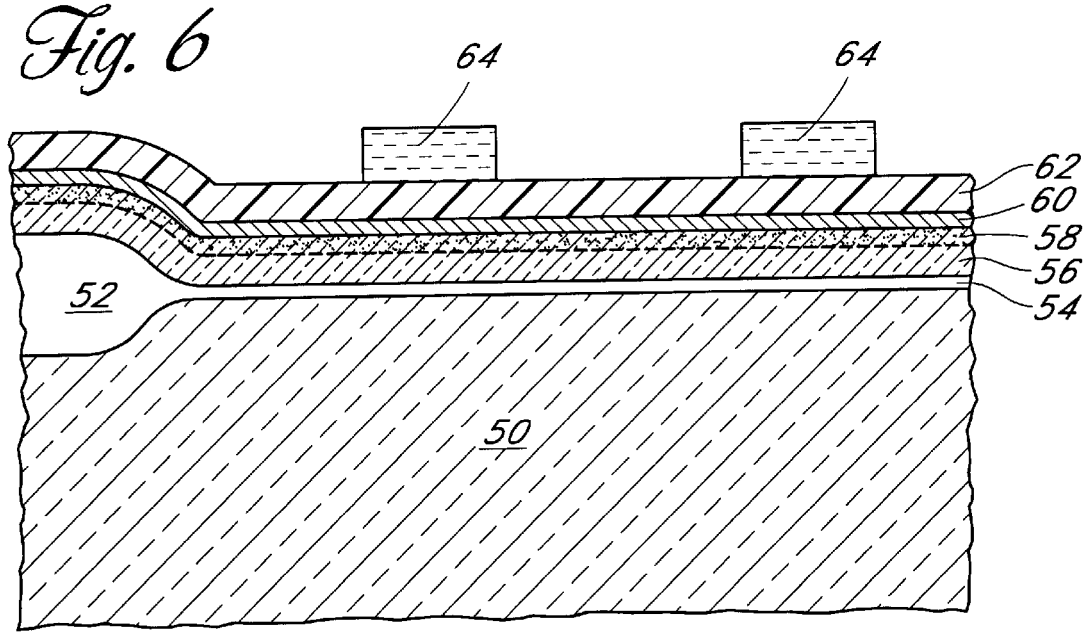

As shown in FIG. 6, the formation of the metal layer 60 is followed by formation of an insulating cap layer 62, typically comprising silicon dioxide or silicon nitride.

After the layers have been formed over the silicon substrate 50, the layers are masked (using known photolithographic techniques) with photoresist 64, and etched through to expose the gate dielectric 54 over transistor source and drain regions. These regions are formed by later doping the substrate to either side of the gate defined by the pattern resist 64.

Since the gate length represents the critical channel length of the integrated transistor, the electrode stack should be etched anisotropically to produce vertical sidewalls, thus faithfully reproducing the dimension on the photoresist mask (about 0.3 micron for a 256 Mbit DRAM circuit). The particular etches used will vary with different metals, silicides, or nitrides. U.S. Pat. No. 5,094,712, issued to Becker, et al. and assigned to the assignee of the present invention, for example, discloses a one-chamber, in situ etched process for etching to an insulating cap oxide/silicide/poly stack. The disclosure of this patent is hereby incorporated by reference.

Figure 7:
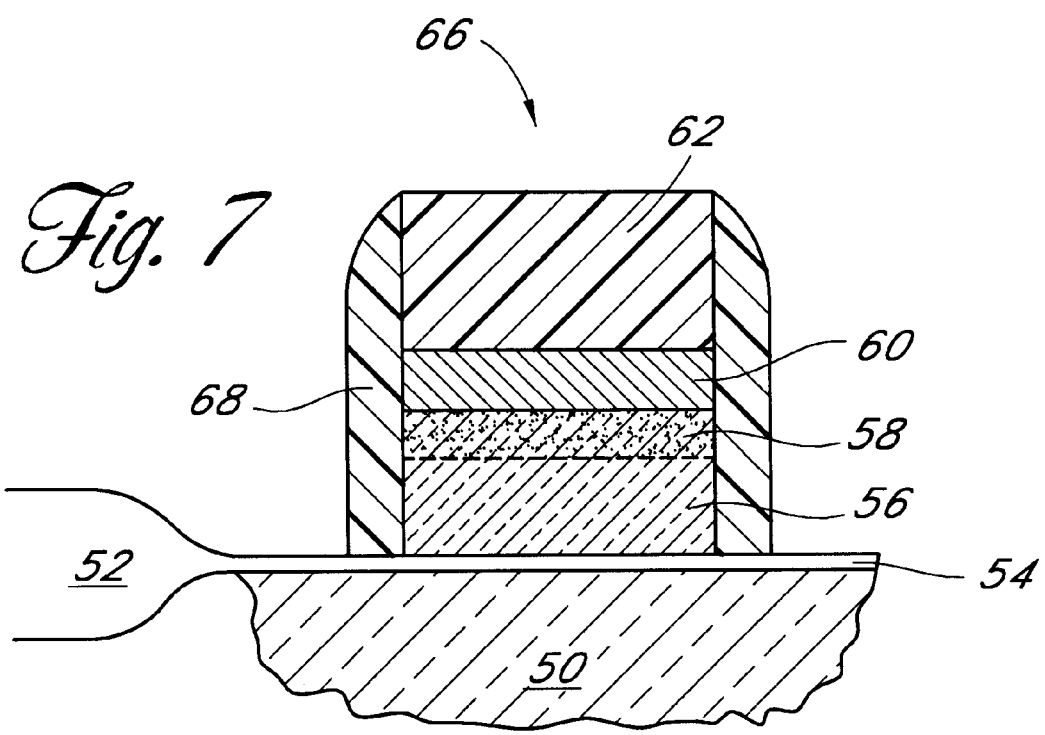
FIG. 7 is a cross-sectional view of a gate structure, constructed in accordance with the preferred embodiment.

Referring now to FIG. 7, a patterned gate structure 66 is shown over the substrate 50. After the gate stack has been etched through, sidewall spacers 68 are formed by conventional blanket deposition and (anisotropic) spacer etch. The spacer 68 typically comprises the same material as the insulating cap 62 (i.e., silicon dioxide or silicon nitride), such that the cap 62 and spacers 68 can protect the gate during selective etches at a later point in the process, as will be recognized by one of skill in the art. The circuit can then be completed according to design and operational rules.

The present application thus discloses a method and structure for protecting the gate dielectric 54 from degradation due to stress or contamination diffusion during high-temperature steps. This protection is particularly valuable during post-silicide deposition anneal, which converts a silicide to a lower resistivity phase. Without the barrier film 58 of the present disclosure, contaminants such as fluorine (or other byproducts of metal or metallic layer deposition) might be permitted to diffuse down to the gate dielectric 54. Furthermore, the re-orientation and growth of grains within the silicide during the post-deposition anneal would cause stress on the gate dielectric 54 in the absence of the barrier film 58. Such stress can also cause gate dielectric defects, which in turn lead to current leakage and device failure.

Furthermore, the barrier film of the present disclosure is easily integrated into existing processes, and can be conducted in situ within the same chamber as the gate poly deposition. Advantageously, the preferred barrier film 58 (nitrogen-doped polysilicon) allows the metallic layer 60 to remain electrically connected to the gate poly 56 while effectively blocking contaminant diffusion therebetween. The barrier film 58 thus does not interfere with the interconnect function (served primarily by the metallic layer 60) or the gate switching function (served primarily by gate poly 56).

Although the foregoing invention has been described in terms of certain preferred embodiments, other embodiments will become apparent to those of ordinary skill in the art, in view of the disclosure herein. Accordingly, the present invention is not intended to be limited by the recitation of the preferred embodiments, but is instead intended to be defined solely by reference to the appended claims.

We claim:

1. A gate stack in an integrated transistor, the stack comprising;

a gate dielectric overlying a semiconductor substrate;

a first silicon layer overlying the gate dielectric;

a conductive layer overlying the first silicon layer, wherein the conductive layer comprises a chemical vapor deposited silicide incorporating fluorine; and a nitrogen-containing second silicon layer interposed between the first silicon layer and the conductive layer, the second silicon layer having a ratio of nitrogen to silicon between about 4:5 and 4:3.5.

2. The gate stack of claim 1, wherein the gate dielectric comprises a silicon oxide layer.

3. The gate stack of claim 1, wherein the first silicon layer comprises conductively doped polysilicon.

4. The gate stack of claim 1, wherein the second silicon layer has a ratio of nitrogen to silicon between about 4:5 and 4:4.

5. The gate stack of claim 1, wherein the conductive layer comprises tungsten silicide.

6. An integrated circuit, comprising:

a semiconductor substrate;

a dielectric layer overlying the substrate;

a conductive silicon layer overlying the dielectric layer;

a metal silicide overlying the silicon layer; and a non-metallic barrier layer interposed between and electrically connecting the metal silicide layer and the silicon layer, the barrier layer having a nitrogen to silicon ratio between about 4:10 and 4:3.5, the barrier layer inhibiting diffusion of impurities between the metal silicide layer and the silicon layer, wherein the metal silicide comprises fluorine impurities, and the barrier layer inhibits diffusion of the fluorine through to the conductive silicon layer.

7. The integrated circuit of claim 6, wherein the barrier layer comprises a silicon nitride layer having a ratio of nitrogen to silicon between about 4:5 and 4:3.5.

8. The integrated circuit of claim 7, wherein the barrier layer comprises a silicon nitride layer having a ratio of nitrogen to silicon between about 4:4 and 4:5.

9. The integrated circuit of claim 6, wherein the barrier layer is formed directly over the conductive silicon layer.

10. The integrated circuit of claim 9, wherein the metal silicide layer is formed directly over the barrier layer.

11. The integrated circuit of claim 10, wherein the metal silicide comprises tungsten silicide.

12. The integrated circuit of claim 6, wherein the conductive silicon layer has a thickness of less than about 500 Å.

13. The integrated circuit of claim 12, wherein the conductive silicon layer has a thickness between about 300 Å and 400 Å.

* * * * *